United States Patent
Huang et al.

(10) Patent No.: US 11,190,198 B1
(45) Date of Patent: Nov. 30, 2021

(54) SWITCHED CAPACITOR CIRCUIT AND CAPACITIVE DAC

(71) Applicant: NOVATEK Microelectronics Corp., Hsin-Chu (TW)

(72) Inventors: Guan-Ying Huang, Tainan (TW); Chih-Yuan Chang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/953,311

(22) Filed: Nov. 19, 2020

(51) Int. Cl.
*H03M 1/06* (2006.01)
*H03H 19/00* (2006.01)

(52) U.S. Cl.
CPC ........ *H03M 1/0604* (2013.01); *H03H 19/004* (2013.01)

(58) Field of Classification Search
CPC ...... H03M 1/468; H03M 3/426; H03M 1/462; H03M 3/458; H03M 1/12; H03M 1/1245; H03M 1/46; H03M 1/804; H03M 3/464; H03M 1/1215; H03M 1/38; H03M 1/08; H03M 1/0854; H03M 1/466; H03M 3/46
USPC .......................... 341/118–122, 150, 155, 192
See application file for complete search history.

(56) References Cited

U.S. PATENT DOCUMENTS

| | | | | |
|---|---|---|---|---|
| 5,134,402 A | * | 7/1992 | Miyoshi | H03M 3/464 341/143 |
| 6,958,722 B1 | * | 10/2005 | Janakiraman | H03M 1/144 341/156 |
| 7,095,356 B1 | * | 8/2006 | Pentakota | H03M 1/1245 341/150 |
| 7,298,800 B2 | * | 11/2007 | Asano | H03G 3/3036 375/344 |
| 8,934,590 B2 | * | 1/2015 | Zhu | H03M 1/1215 375/349 |
| 9,787,291 B1 | * | 10/2017 | Reindl | H03H 19/004 |
| 9,806,730 B1 | * | 10/2017 | Dusad | H03M 1/08 |
| 2013/0207827 A1 | * | 8/2013 | Nestler | H03M 1/12 341/172 |
| 2014/0218223 A1 | * | 8/2014 | Darshan | H03M 3/474 341/143 |
| 2015/0207518 A1 | * | 7/2015 | Liu | H03M 1/0678 327/554 |

* cited by examiner

*Primary Examiner* — Linh V Nguyen
(74) *Attorney, Agent, or Firm* — Winston Hsu

(57) ABSTRACT

A switched capacitor circuit includes an output capacitor, a first transmission switch, a first reference buffer, a second transmission switch, a second reference buffer and a charge compensation circuit. The output capacitor includes a first terminal and a second terminal, wherein the first terminal is coupled to an output terminal of the switched capacitor circuit, and the second terminal is coupled to a reference node. The first transmission switch is coupled to the reference node. The first reference buffer is coupled to the first transmission switch. The second transmission switch is coupled to the reference node. The second reference buffer is coupled to the second transmission switch. The charge compensation circuit is coupled to the reference node.

20 Claims, 17 Drawing Sheets

SWITCHED CAPACITOR CIRCUIT AND CAPACITIVE DAC

BACKGROUND OF THE INVENTION

1. Field of the Invention

The present invention relates to a switched capacitor circuit, and more particularly, to a switched capacitor circuit with a charge compensation scheme.

2. Description of the Prior Art

A switched capacitor circuit is widely applied in various circuit systems, for generating a switching output voltage. By controlling the switches in the switched capacitor circuit to be turned on or off, different input voltages may be coupled to the output terminal through an output capacitor of the switched capacitor circuit, so that the output voltage can be switched between various voltage levels. In general, each input voltage may be provided through a reference buffer or reference voltage generator. The reference buffer is configured to supply electric charges for charging or discharging the output capacitor, so as to drive the output voltage to be switched. Therefore, the output capability of the reference buffer may determine the settling speed of the voltage switching. In order to reduce the settling time of the output voltage, the reference buffer is requested to have a higher output capability. However, the higher output capability is usually accompanied by more power consumption. The output capability requirement and the power consumption issue will become a burden on the design of the reference buffer.

SUMMARY OF THE INVENTION

It is therefore an objective of the present invention to provide a switched capacitor circuit having a charge compensation scheme, where a charge compensation circuit is applied to supply electric charges for charging or discharging the output capacitor; hence, the settling speed of the switched capacitor circuit may be improved, and the burden on output capability of the reference buffer may be reduced, which in turn reduces the design difficulty of the reference buffer.

An embodiment of the present invention discloses a switched capacitor circuit, which comprises an output capacitor, a first transmission switch, a first reference buffer, a second transmission switch, a second reference buffer and a charge compensation circuit. The output capacitor comprises a first terminal and a second terminal, wherein the first terminal is coupled to an output terminal of the switched capacitor circuit, and the second terminal is coupled to a reference node. The first transmission switch is coupled to the reference node. The first reference buffer is coupled to the first transmission switch. The second transmission switch is coupled to the reference node. The second reference buffer is coupled to the second transmission switch. The charge compensation circuit is coupled to the reference node.

Another embodiment of the present invention discloses a capacitive digital-to-analog converter (DAC), which comprises a plurality of switched capacitor circuits. Each of the switched capacitor circuits comprises an output capacitor, a first transmission switch, a second transmission switch and a charge compensation circuit. The output capacitor comprises a first terminal and a second terminal, wherein the first terminal is coupled to an output terminal of the capacitive DAC, and the second terminal is coupled to a reference node. The first transmission switch is coupled between the reference node and a first reference buffer. The second transmission switch is coupled between the reference node and a second reference buffer. The charge compensation circuit is coupled to the reference node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
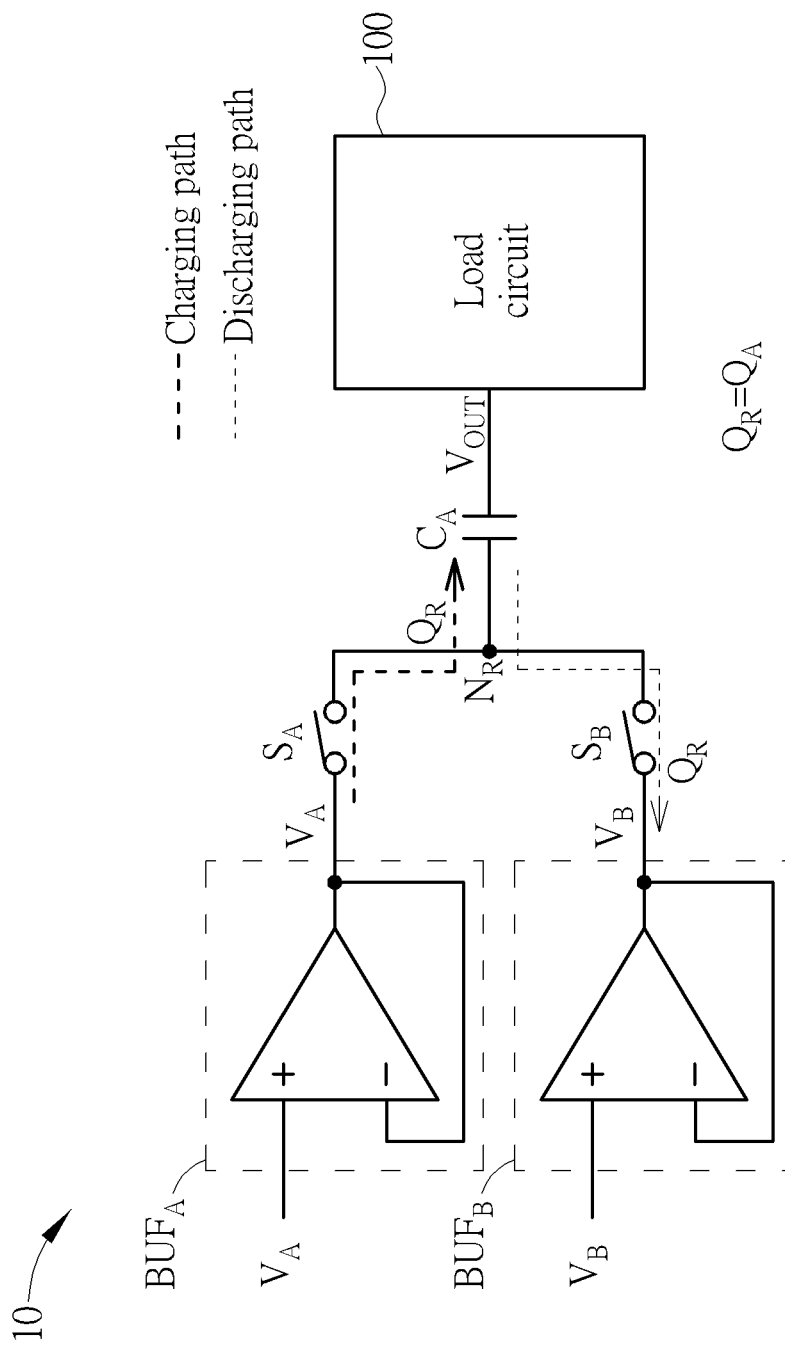
FIG. 1 is a schematic diagram of a general switched capacitor circuit.

Please refer to FIG. 1, which is a schematic diagram of a general switched capacitor circuit 10. As shown in FIG. 1, the switched capacitor circuit 10 includes an output capacitor $C_A$, transmission switches $S_A$ and $S_B$, and reference buffers $BUF_A$ and $BUF_B$. A load circuit 100 may not be included in the switched capacitor circuit 10, but shown in FIG. 1 to facilitate the illustration. The load circuit 100 generally refers to a circuit device or module that operates by receiving a switching voltage from the switched capacitor circuit 10.

In the switched capacitor circuit 10, the output capacitor $C_A$ is configured to provide an output voltage $V_{OUT}$ for the load circuit 100 to realize various applications. In detail, a first terminal of the output capacitor $C_A$ is coupled to the output terminal of the switched capacitor circuit 10, and a second terminal of the output capacitor $C_A$ is coupled to a reference node $N_R$. The transmission switches $S_A$ and $S_B$ are respectively coupled to the output capacitor $C_A$ through the reference node $N_R$. Another terminal of the transmission switches $S_A$ and $S_B$ are coupled to the reference buffers $BUF_A$ and $BUF_B$, respectively. The transmission switches $S_A$ and $S_B$ may be implemented with transmission gates, transistors, or any other possible circuit elements or modules. Each of the reference buffers $BUF_A$ and $BUF_B$ may be implemented with an operational amplifier connected as a buffer, where the operational amplifier is served to provide output capability (or called driving capability) to output a specific voltage. In this embodiment, the reference buffer $BUF_A$ and the transmission switch $S_A$ are configured to output a voltage $V_A$, and the reference buffer $BUF_B$ and the transmission switch $S_B$ are configured to output a voltage $V_B$.

Figure 2:
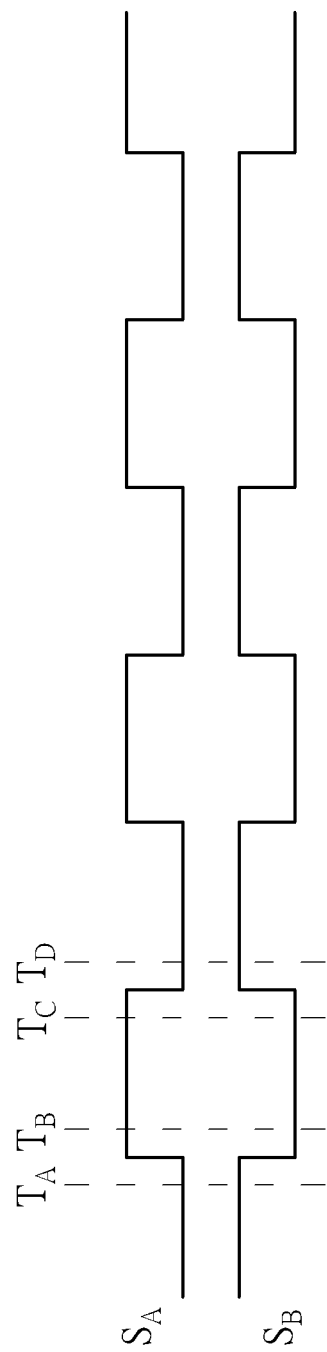
FIG. 2 is an exemplary waveform diagram of the operations of the switched capacitor circuit.

FIG. 2 is an exemplary waveform diagram of the operations of the switched capacitor circuit 10. FIG. 2 illustrates the waveforms of control signals for the transmission switches $S_A$ and $S_B$. In order to output the switching output voltage $V_{OUT}$ through the first terminal of the output capacitor $C_A$, the second terminal of the output capacitor $C_A$ may alternately receive the voltages $V_A$ and $V_B$ through the reference node $N_R$. With the control of the switches $S_A$ and $S_B$, the reference node $N_R$ may be switched from the voltage $V_A$ to the voltage $V_B$ or switched from the voltage $V_B$ to the voltage $V_A$. During the switching operations, the reference buffers $BUF_A$ and $BUF_B$ are configured to charge or discharge the reference node $N_R$, in order to push or pull the electric charges stored in the output capacitor $C_A$.

As shown in FIG. 2, the control signals for the transmission switches $S_A$ and $S_B$ are complementary signals, to ensure that the reference node $N_R$ is configured to receive one of the voltages $V_A$ and $V_B$ at each time point. In this embodiment, the control signals at a higher level may turn on (connect) the corresponding switches and at a lower level may turn off (disconnect) the corresponding switches. At the time point $T_A$, the switch $S_A$ is turned off and the switch $S_B$ is turned on, allowing the reference node $N_R$ to receive the voltage $V_B$. Subsequently, at the time point $T_B$, the switch $S_A$ is turned on and the switch $S_B$ is turned off, allowing the reference node $N_R$ to receive the voltage $V_A$. Supposing that the voltage $V_A$ is higher than the voltage $V_B$, when the reference node $N_R$ is switched from the lower voltage $V_B$ to the higher voltage $V_A$ (e.g., from $T_A$ to $T_B$), the electric charges for charging the output capacitor $C_A$ are entirely received from the reference buffer $BUF_A$. For example, if the amount of electric charges supplied from the reference buffer $BUF_A$ is $Q_R$, and the amount of electric charges for driving the reference node $N_R$ to rise to the voltage $V_A$ from the voltage $V_B$ is $Q_A$, the electric charge amount $Q_R$ may be equal to $Q_A$ (i.e., $Q_R = Q_A$).

From the time point $T_B$ to the time point $T_C$, the statuses of the switches $S_A$ and $S_B$ do not change; that is, the second terminal of the output capacitor $C_A$ and the reference node $N_R$ are kept at the voltage $V_A$, and no charging or discharging operation is performed.

At the time point $T_C$, the switch $S_A$ is turned on and the switch $S_B$ is turned off, allowing the reference node $N_R$ to receive the voltage $V_A$. Subsequently, at the time point $T_D$, the switch $S_A$ is turned off and the switch $S_B$ is turned on, allowing the reference node $N_R$ to receive the voltage $V_B$. When the reference node $N_R$ is switched from the higher voltage $V_A$ to the lower voltage $V_B$ (e.g., from $T_C$ to $T_D$), the electric charges from the output capacitor $C_A$ are entirely released through the reference buffer $BUF_B$. For example, if the amount of electric charges released through the reference buffer $BUF_B$ is $Q_R$, and the amount of electric charges for driving the reference node $N_R$ to fall to the voltage $V_B$ from the voltage $V_A$ is $Q_A$, the electric charge amount $Q_R$ may be equal to $Q_A$ (i.e., $Q_R = Q_A$).

During the switching operations from the time point $T_A$ to $T_B$ and from the time point $T_C$ to $T_B$, the reference buffer $BUF_A$ supplies the required electric charges to the output capacitor $C_A$, and the reference buffer $BUF_B$ releases the additional electric charges from the output capacitor $C_A$. In order to achieve faster switching on the output voltage $V_{OUT}$, the output capacitor $C_A$ should be charged and discharged more rapidly. Therefore, the output capability of the reference buffers $BUF_A$ and $BUF_B$ should be stronger, so that the voltage at the reference node $N_R$ can be settled more rapidly in the switching operations. However, the stronger output capability of the reference buffers $BUF_A$ and $BUF_B$ is usually accompanied by larger current consumption, higher power requirement and higher design difficulty.

Figure 3:
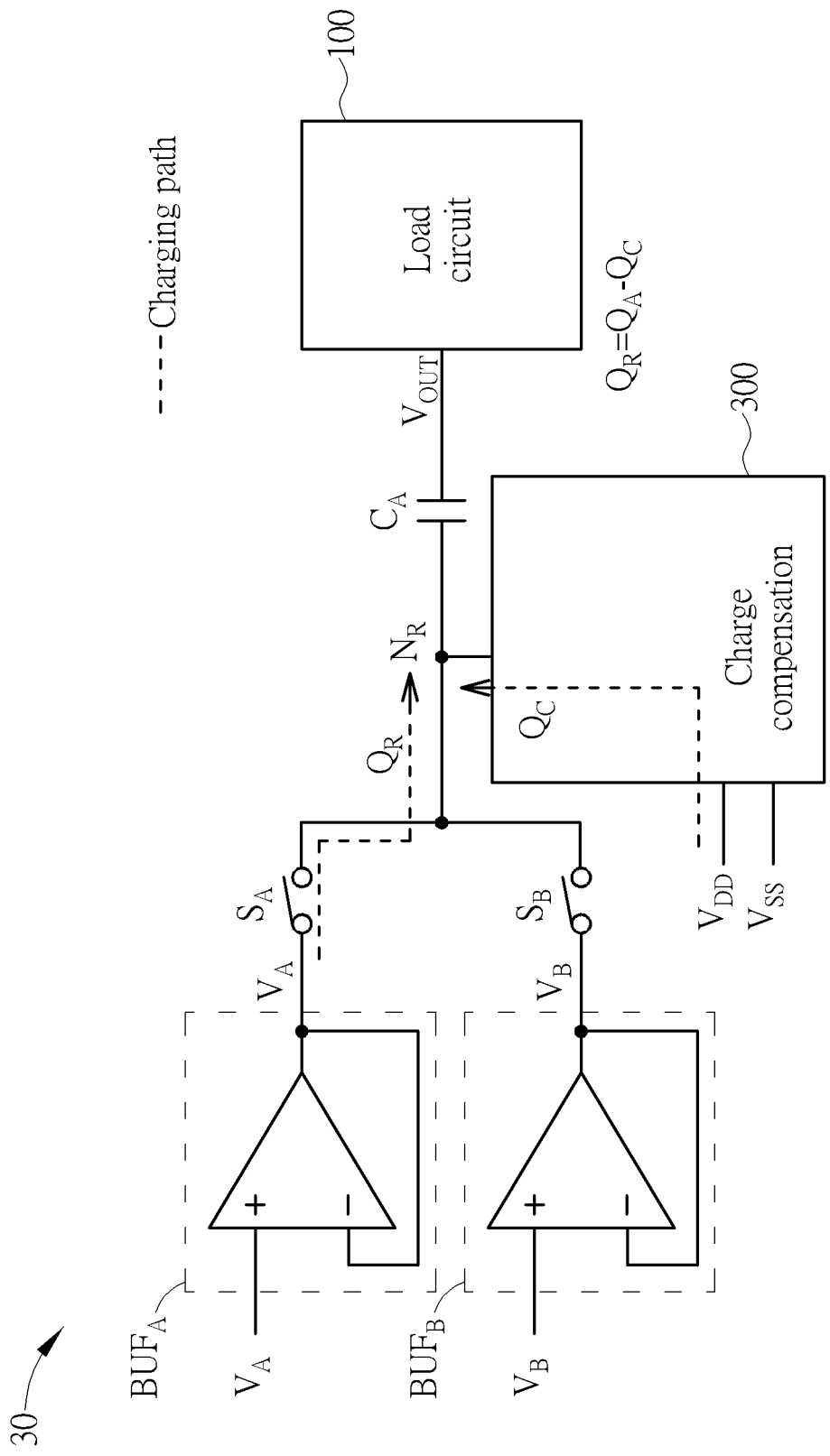
FIGS. 3 and 4 are schematic diagrams of a switched capacitor circuit according to an embodiment of the present invention.
Figure 4:
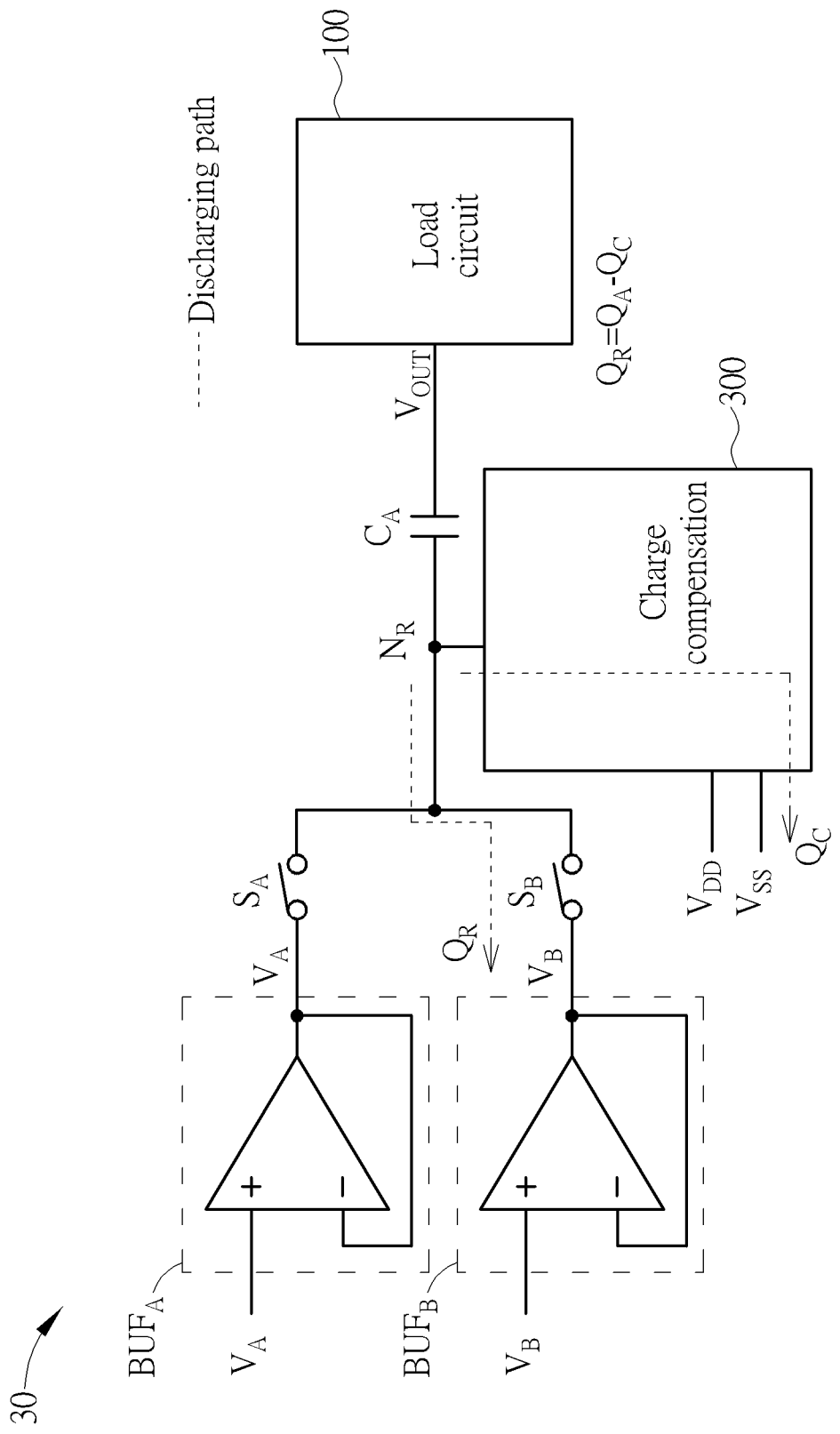

Please refer to FIGS. 3 and 4, which are schematic diagrams of a switched capacitor circuit 30 according to an embodiment of the present invention. As shown in FIGS. 3 and 4, the circuit structure of the switched capacitor circuit 30 is similar to the circuit structure of the switched capacitor circuit 10 shown in FIG. 1, so signals and elements having similar functions are denoted by the same symbols. The difference between the switched capacitor circuit 30 and the switched capacitor circuit 10 is that, the switched capacitor circuit 30 further includes a charge compensation circuit 300. The charge compensation circuit 300 is coupled to the reference node $N_R$, for supplying several electric charges to the output capacitor $C_A$ or releasing several electric charges from the output capacitor $C_A$ in order to reduce the burden of the reference buffers $BUF_A$ and $BUF_B$. The operations of the charge compensation circuit 300 may be performed according to the voltage change on the reference node $N_R$. In detail, if the reference node $N_R$ needs to be switched from a lower voltage (e.g., $V_B$) to a higher voltage (e.g., $V_A$), the charge compensation circuit 300 may charge the output capacitor $C_A$ and drive the voltage of the reference node $N_R$ to increase. If the reference node $N_R$ needs to be switched from a higher voltage (e.g., $V_A$) to a lower voltage (e.g., $V_B$), the charge compensation circuit 300 may discharge the output capacitor $C_A$ and drive the voltage of the reference node $N_R$ to decrease.

In an embodiment, the charge compensation circuit 300 may be coupled to a first power supply node for receiving a first supply voltage $V_{DD}$, which may be a positive supply voltage of the circuit system. The charge compensation circuit 300 may also be coupled to a second power supply node for receiving a second supply voltage $V_{SS}$, which may be a negative supply voltage or a ground voltage of the circuit system. In general, the first supply voltage $V_{DD}$ may be a voltage having the highest level in the circuit system, and the second supply voltage $V_{SS}$ may be a voltage having the lowest level in the circuit system. The supply voltages $V_{DD}$ and $V_{SS}$ are usually supplied from the most powerful voltage sources of the circuit system, which are capable of rapidly sourcing or sinking electric charges, and thus will be preferable for fast driving the switched capacitor circuit 30 to switch the output voltage $V_{OUT}$.

FIG. 3 illustrates a charging operation of the charge compensation circuit 300. When the reference node $N_R$ needs to be switched from the lower voltage $V_B$ to the higher voltage $V_A$ (e.g., from $T_A$ to $T_B$ as shown in FIG. 2), a charging path between the first power supply node that supplies the first supply voltage $V_{DD}$ and the reference node $N_R$ may be conducted; hence, the charge compensation circuit 300 may supply electric charges to charge the output capacitor $C_A$ by receiving the electric charges from the first power supply node. In this embodiment, the amount of electric charges received from the first power supply node may be $Q_C$. Since the amount of electric charges that drive the reference node $N_R$ to rise to the voltage $V_A$ from the voltage $V_B$ is $Q_A$, the total electric charge amount $Q_R$ required for the reference buffer $BUF_A$ to charge the output capacitor $C_A$ may be reduced to $Q_A$ minus $Q_C$ (i.e., $Q_R=Q_A-Q_C$).

FIG. 4 illustrates a discharging operation of the charge compensation circuit 300. When the reference node $N_R$ needs to be switched from the higher voltage $V_A$ to the lower voltage $V_B$ (e.g., from $T_C$ to $T_D$ as shown in FIG. 2), a discharging path between the second power supply node that supplies the second supply voltage $V_{SS}$ and the reference node $N_R$ may be conducted; hence, the charge compensation circuit 300 may discharge the output capacitor $C_A$ by releasing the electric charges to the second power supply node. Similarly, the amount of electric charges released to the second power supply node may be $Q_C$. Since the amount of electric charges that drive the reference node $N_R$ to fall to the voltage $V_B$ from the voltage $V_A$ is $Q_A$, the total electric charge amount $Q_R$ required for the reference buffer $BUF_B$ to discharge the output capacitor $C_A$ may be reduced to $Q_A$ minus $Q_C$ (i.e., $Q_R=Q_A-Q_C$).

In such a situation, the amount of electric charges processed by the reference buffers $BUF_A$ and $BUF_B$ may be reduced; hence, the requirements of output capability of the reference buffers $BUF_A$ and $BUF_B$ may thereby be reduced. Since the charge compensation circuit 300 is able to provide parts of the electric charges for the output capacitor $C_A$, the settling time of the output voltage $V_{OUT}$ may be reduced under identical output capability of the reference buffers $BUF_A$ and $BUF_B$. Therefore, the operation speed of the switched capacitor circuit 30 may be accelerated.

Figure 5:
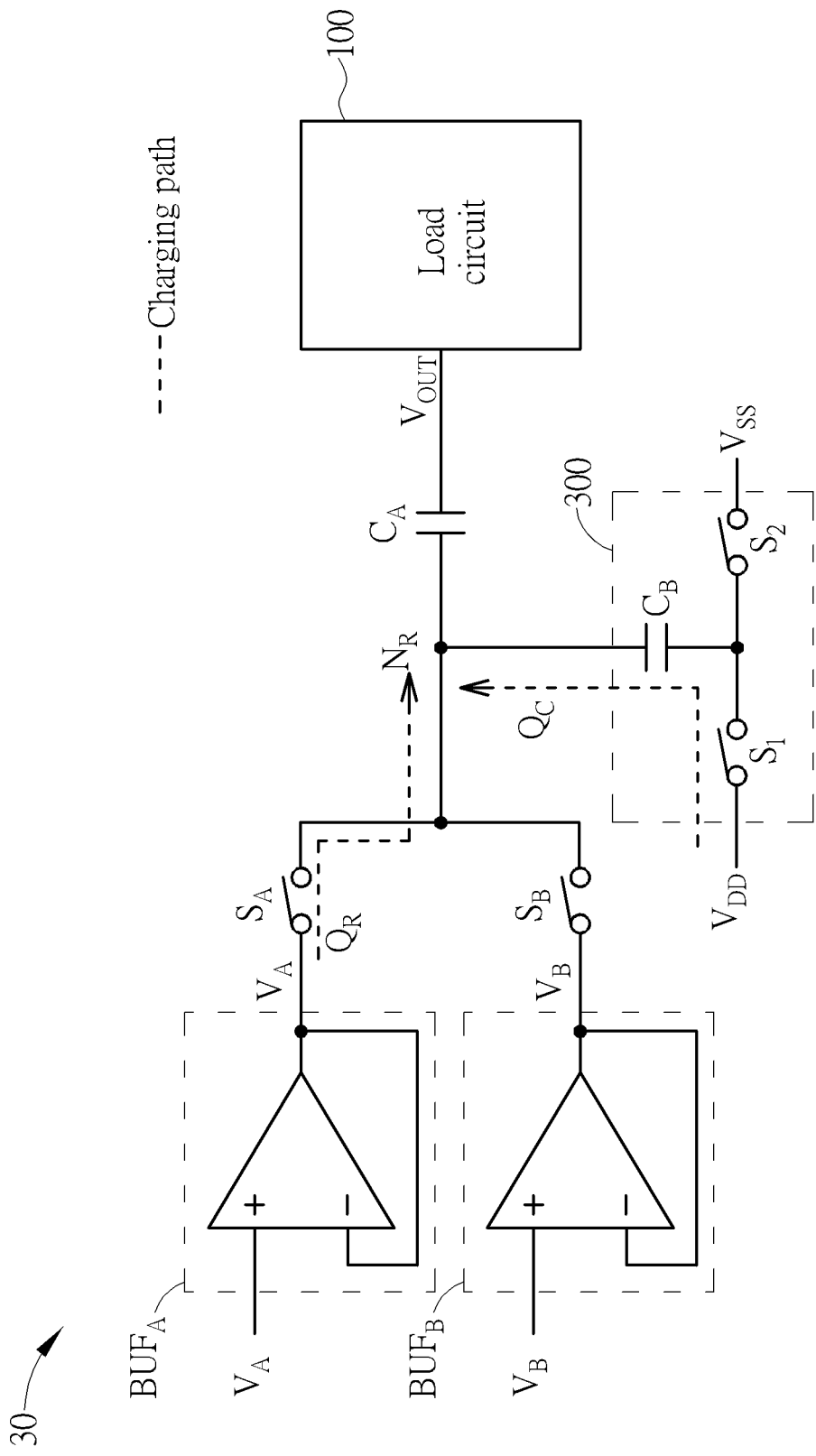
FIGS. 5 and 6 are schematic diagrams of the switched capacitor circuit with an implementation of the charge compensation circuit according to an embodiment of the present invention.
Figure 6:
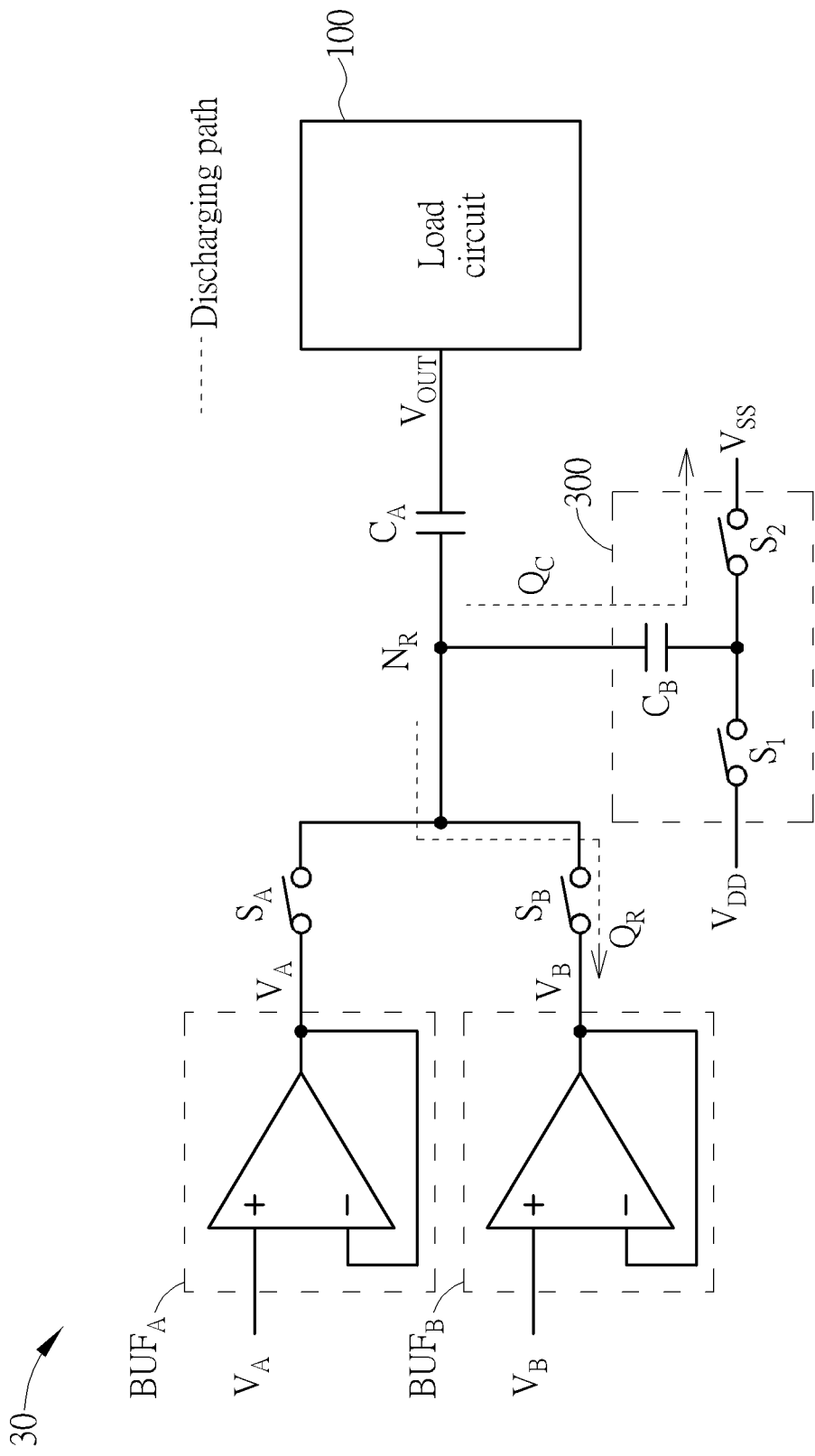

Please refer to FIGS. 5 and 6, which are schematic diagrams of the switched capacitor circuit 30 with an implementation of the charge compensation circuit 300 according to an embodiment of the present invention. As shown in FIGS. 5 and 6, the charge compensation circuit 300 may include a compensation capacitor $C_B$ and two compensation switches $S_1$ and $S_2$. A first terminal of the compensation capacitor $C_B$ is coupled to the reference node $N_R$, and a second terminal of the compensation capacitor $C_B$ is coupled to the compensation switches $S_1$ and $S_2$. The compensation switch $S_1$ is further coupled to the first power supply node for receiving the first supply voltage $V_{DD}$, and the compensation switch $S_2$ is further coupled to the second power supply node for receiving the second supply voltage $V_{SS}$.

Figure 7:
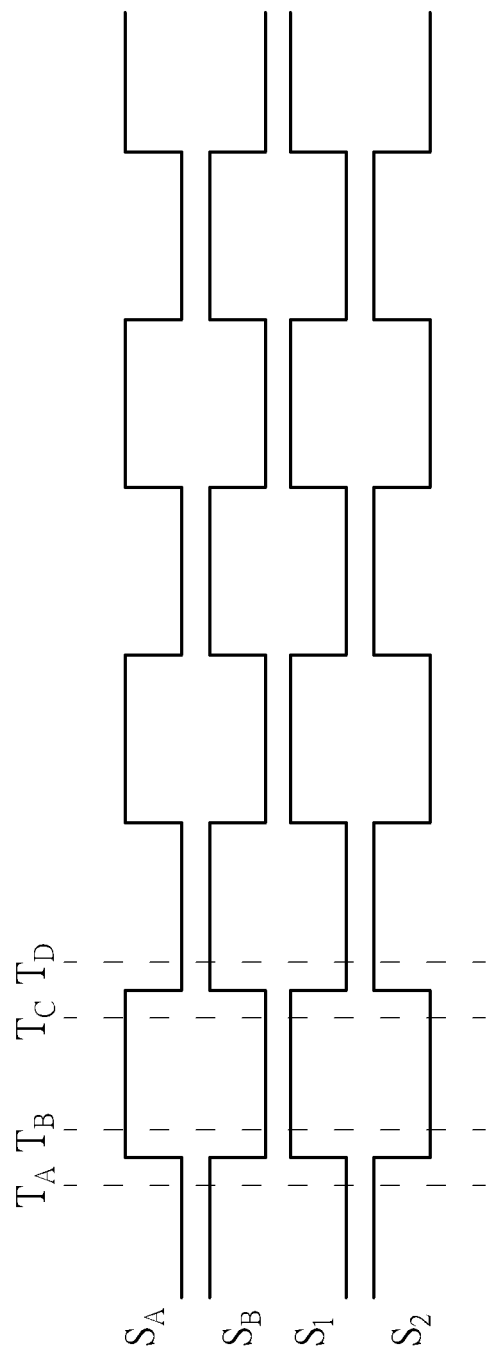
FIG. 7 is an exemplary waveform diagram of the operations of the switched capacitor circuit shown in FIGS. 5 and 6.

FIG. 7 is an exemplary waveform diagram of the operations of the switched capacitor circuit 30 shown in FIGS. 5 and 6. FIG. 7 illustrates the waveforms of control signals for the transmission switches $S_A$ and $S_B$ and the compensation switches $S_1$ and $S_2$, where those control signals at a higher level may turn on (connect) the corresponding switches and at a lower level may turnoff (disconnect) the corresponding switches. The detailed operations of the transmission switches $S_A$ and $S_B$ are similar to those of the switched capacitor circuit 10 as described in the above paragraphs, and will not be repeated herein. The control signals for the compensation switches $S_1$ and $S_2$ are complementary signals, to ensure that the compensation capacitor $C_B$ is configured to receive one of the supply voltages $V_{DD}$ and $V_{SS}$ at each time point. In this embodiment, the control signals for the compensation switch $S_1$ and the transmission switch $S_A$ are identical; hence, when the transmission switch $S_A$ is turned on and the reference node $N_R$ receives the voltage $V_A$ from the reference buffer $BUF_A$, the compensation switch $S_1$ is turned on to allow the compensation capacitor $C_B$ to receive the first supply voltage $V_{DD}$. Similarly, the control signals for the compensation switch $S_2$ and the transmission switch $S_B$ are identical; hence, when the transmission switch $S_B$ is turned on and the reference node $N_R$ receives the voltage $V_B$ from the reference buffer $BUF_B$, the compensation switch $S_2$ is turned on to allow the compensation capacitor $C_B$ to receive the second supply voltage $V_{SS}$.

Please continue to refer to FIG. 7 together with FIG. 5, which illustrates a charging operation of the charge compensation circuit 300. At the time point $T_A$, the switch $S_1$ is turned off and the switch $S_2$ is turned on, allowing the second terminal of the compensation capacitor $C_B$ to be coupled to the second power supply node to receive the second supply voltage $V_{SS}$. Subsequently, at the time point $T_B$, the switch $S_1$ is turned on and the switch $S_2$ is turned off, allowing the second terminal of the compensation capacitor $C_B$ to be coupled to the first power supply node to receive the first supply voltage $V_{DD}$. Therefore, from the time point $T_A$ to $T_B$, the reference node $N_R$ is switched from the voltage $V_B$ to the voltage $V_A$, and meanwhile, the second terminal of the compensation capacitor $C_B$ is switched from the second supply voltage $V_{SS}$ to the first supply voltage $V_{DD}$. The rising voltage level of the compensation capacitor $C_B$ may provide electric charges to drive the voltage of the reference node $N_R$ to increase.

In such a situation, the charge compensation circuit 300 may supply electric charges to the output capacitor $C_A$ (i.e., $Q_C$) by coupling of the compensation capacitor $C_B$, and the rest electric charges are received from the reference buffer $BUF_A$. Therefore, the amount of electric charges required to be supplied from the reference buffer $BUF_A$ (i.e., $Q_R$) may be reduced to the total amount of electric charges required for driving the output capacitor $C_A$ (i.e., $Q_A$) minus the compensation electric charges supplied from the charge compensation circuit 300; that is, $Q_R=Q_A-Q_C$. As a result, the reference buffer $BUF_A$ may not need to have larger output capability, so that the power consumption of the reference buffer $BUF_A$ may be reduced. Also, the settling speed of the voltages of the switched capacitor circuit 30 may be improved due to the strong output capability of the charge compensation circuit 300.

In this embodiment, the voltage on the second terminal of the compensation capacitor $C_B$ is boosted from the second supply voltage $V_{SS}$ to the first supply voltage $V_{DD}$. Based on the capacitance formula $Q=C\times\Delta V$, the electric charges coupled from the compensation capacitor $C_B$ (Q) may be equal to the capacitance value of the compensation capacitor $C_B$ (C) multiplied by the voltage difference received by the compensation capacitor $C_B$ ($\Delta V$). Therefore, the supplied electric charges may be well controlled based on the capacitance value and/or the voltage change of the compensation capacitor $C_B$. For example, the electric charge amount $Q_C$ supplied from the charge compensation circuit 300 may be configured to approach the total amount of electric charges required for driving the output capacitor $C_A$, so that the loading of the reference buffer $BUF_A$ may be minimized. In another embodiment, the first supply voltage $V_{DD}$ and/or the second supply voltage $V_{SS}$ may be supplied from a specific voltage generator and thus have a predefined voltage, to control the charge compensation circuit 300 to output an appropriate amount of electric charges to the output capacitor $C_A$. In such a situation, the first supply voltage $V_{DD}$ and/or the second supply voltage $V_{SS}$ may not need to have the highest or the lowest voltage level in the circuit system.

Please continue to refer to FIG. 7 together with FIG. 6, which illustrates a discharging operation of the charge compensation circuit 300. At the time point $T_C$, the switch $S_1$ is turned on and the switch $S_2$ is turned off, allowing the second terminal of the compensation capacitor $C_B$ to be coupled to the first power supply node to receive the first supply voltage $V_{DD}$. Subsequently, at the time point $T_D$, the switch $S_1$ is turned off and the switch $S_2$ is turned on, allowing the second terminal of the compensation capacitor $C_B$ to be coupled to the second power supply node to receive the second supply voltage $V_{SS}$. Therefore, from the time point $T_C$ to $T_D$, the reference node $N_R$ is switched from the voltage $V_A$ to the voltage $V_B$, and meanwhile, the second terminal of the compensation capacitor $C_B$ is switched from the first supply voltage $V_{DD}$ to the second supply voltage $V_{SS}$. The falling voltage level of the compensation capacitor $C_B$ may release electric charges to drive the voltage of the reference node $N_R$ to decrease.

In such a situation, the charge compensation circuit 300 may draw electric charges from the output capacitor $C_A$ (i.e., $Q_C$) by coupling of the compensation capacitor $C_B$, and the rest electric charges are released through the reference buffer $BUF_B$. Therefore, the amount of electric charges required to be released through the reference buffer $BUF_B$ (i.e., $Q_R$) may be reduced to the total amount of electric charges required for driving the output capacitor $C_A$ (i.e., $Q_A$) minus the compensation electric charges drawn by the charge compensation circuit 300; that is, $Q_R=Q_A-Q_C$. As a result, the reference buffer $BUF_B$ may not need to have larger output capability, so that the power consumption of the reference buffer $BUF_B$ may be reduced. Also, the settling speed of the voltages of the switched capacitor circuit 30 may be improved due to the strong output capability of the charge compensation circuit 300.

Figure 8:
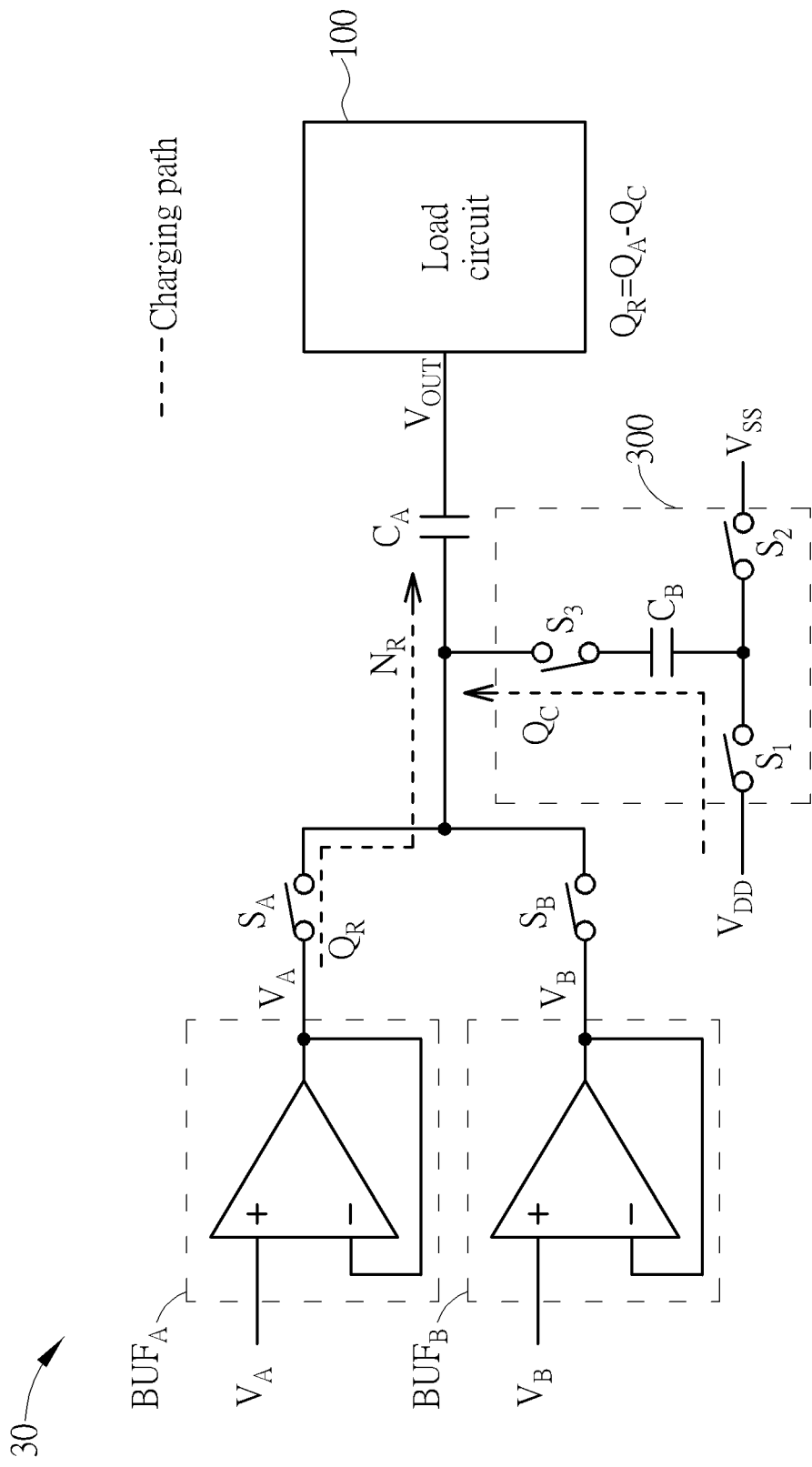
FIGS. 8 and 9 are schematic diagrams of the switched capacitor circuit with a further implementation of the charge compensation circuit according to an embodiment of the present invention.
Figure 9:
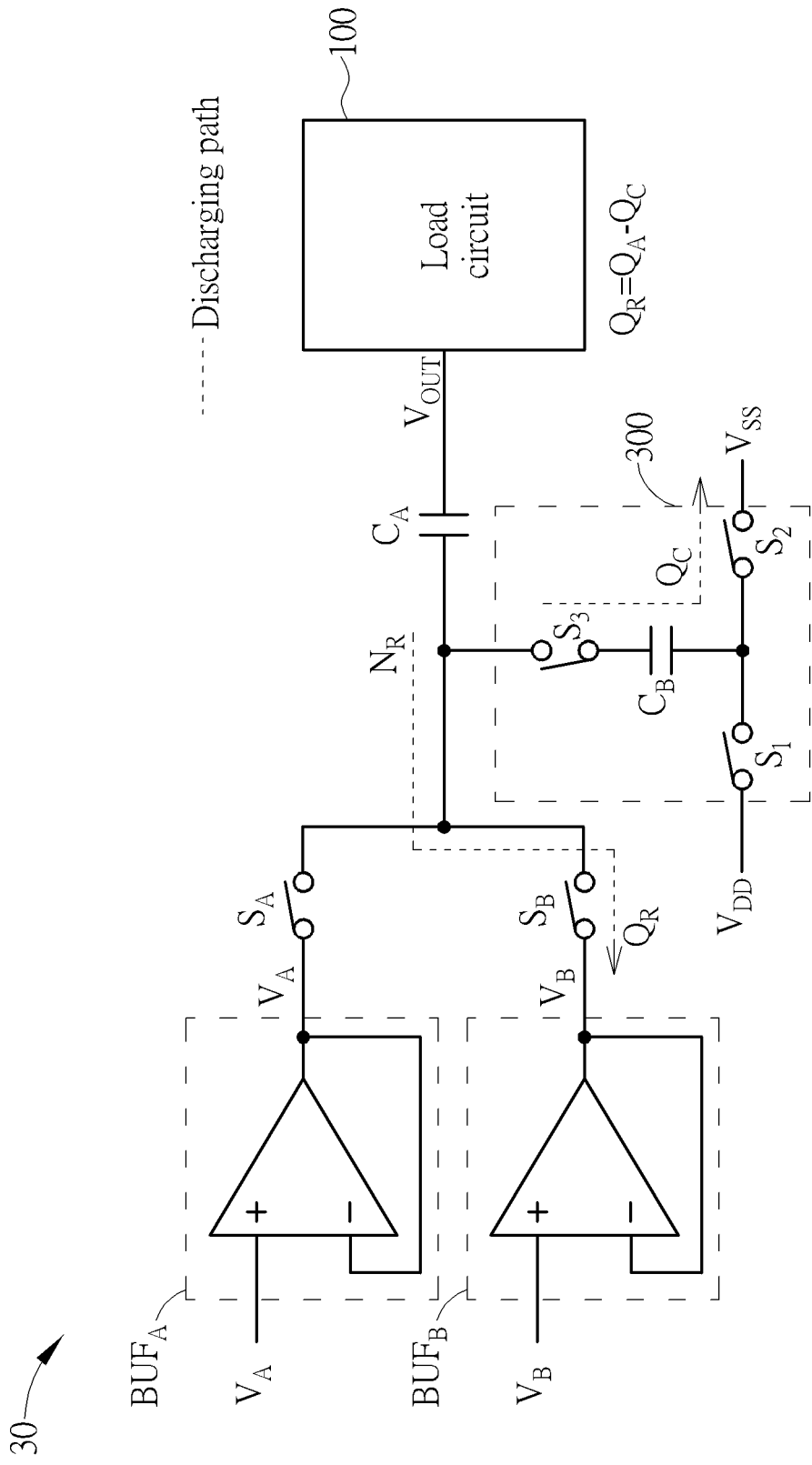

Please refer to FIGS. 8 and 9, which are schematic diagrams of the switched capacitor circuit 30 with a further implementation of the charge compensation circuit 300 according to an embodiment of the present invention. As shown in FIGS. 8 and 9, in addition to the compensation capacitor $C_B$ and the compensation switches $S_1$ and $S_2$, the charge compensation circuit 300 further includes a compensation switch $S_3$. The compensation switch $S_3$ is coupled between the reference node $N_R$ and the compensation capacitor $C_B$. In this embodiment, the implementations of the compensation capacitor $C_B$ and the compensation switches $S_1$ and $S_2$ and the flow of electric charges are similar to those of the embodiments shown in FIGS. 5 and 6, and will not be narrated herein.

Figure 10:
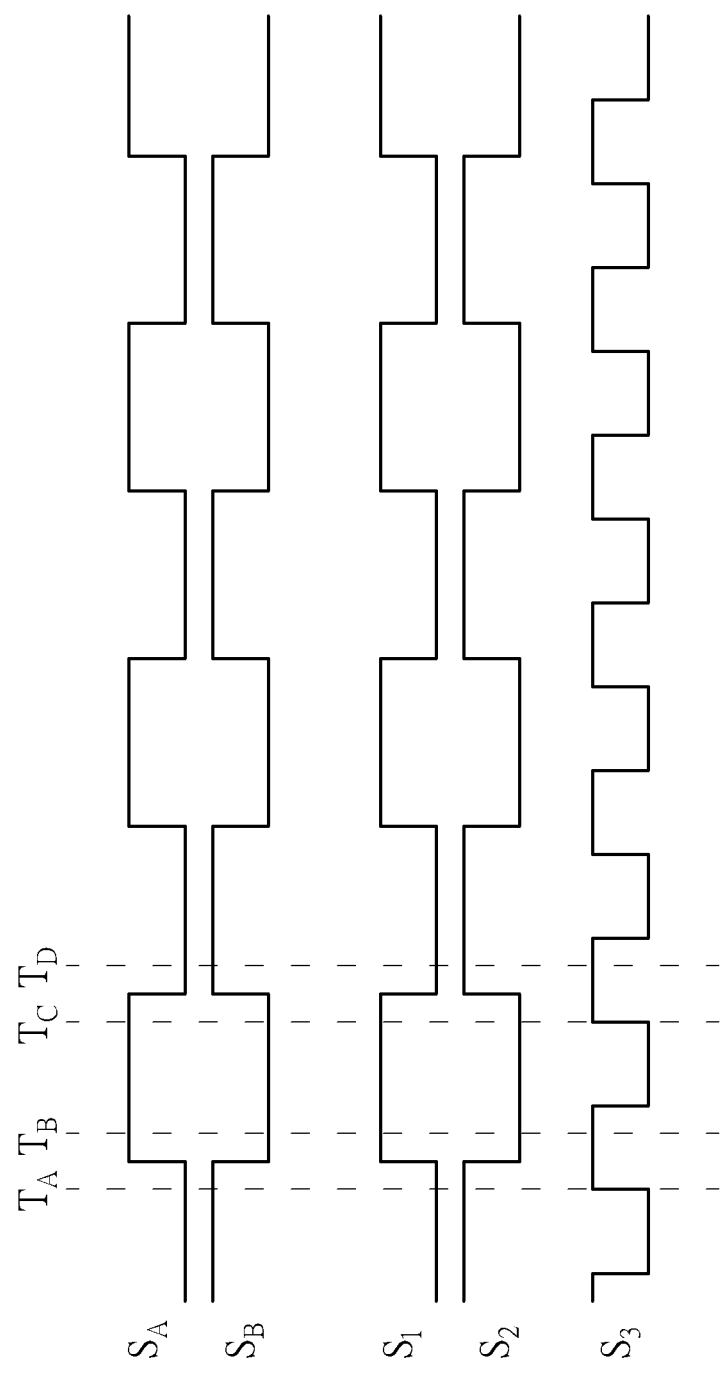
FIG. 10 is an exemplary waveform diagram of the operations of the switched capacitor circuit shown in FIGS. 8 and 9.

FIG. 10 is an exemplary waveform diagram of the operations of the switched capacitor circuit 30 shown in FIGS. 8 and 9. FIG. 10 illustrates the waveforms of control signals for the transmission switches $S_A$ and $S_B$ and the compensation switches $S_1$, $S_2$ and $S_3$, where those control signals at a higher level may turn on (connect) the corresponding switches and at a lower level may turnoff (disconnect) the corresponding switches. The detailed operations of the transmission switches $S_A$ and $S_B$ and the compensation switches $S_1$ and $S_2$ are similar to those of the switched capacitor circuits as described in the above paragraphs, and will not be repeated herein.

As shown in FIG. 10, the compensation switch $S_3$ is turned on to connect the compensation capacitor $C_B$ to the output capacitor $C_A$ at the voltage switching time, where the transmission switches $S_A$ and $S_B$ and the compensation switches $S_1$ and $S_2$ change their statuses and the voltage of the reference node $N_R$ is switched from $V_B$ to $V_A$ or from $V_A$ to $V_B$. With the turned-on compensation switch $S_3$, the electric charges required for the output capacitor $C_A$ may be coupled from or to the compensation capacitor $C_B$. At the time when these switches do not change their statuses and the voltage of the reference node $N_R$ is constant, the compensation switch $S_3$ may be turned off.

As mentioned above, the electric charges of the charge compensation circuit 300 may be supplied from the first supply voltage $V_{DD}$ and released to the second supply voltage $V_{SS}$. The supply voltages $V_{DD}$ and $V_{SS}$ are usually received from the global voltage sources of the circuit system. The global voltage sources are configured to supply voltages to the entire circuit system, and thus may usually have non-ignorable power noises. In order to prevent the power noises from being coupled through the compensation capacitor $C_B$ to interfere with the voltage of the reference node $N_R$, it is preferable to dispose a switch to isolate the power noises on the global voltage sources. Therefore, the compensation switch $S_3$ may be turned off at the time when the voltage of the reference node $N_R$ and the output voltage of the switched capacitor circuit 30 remain constant, in order to improve the stability of the voltages.

Figure 11:
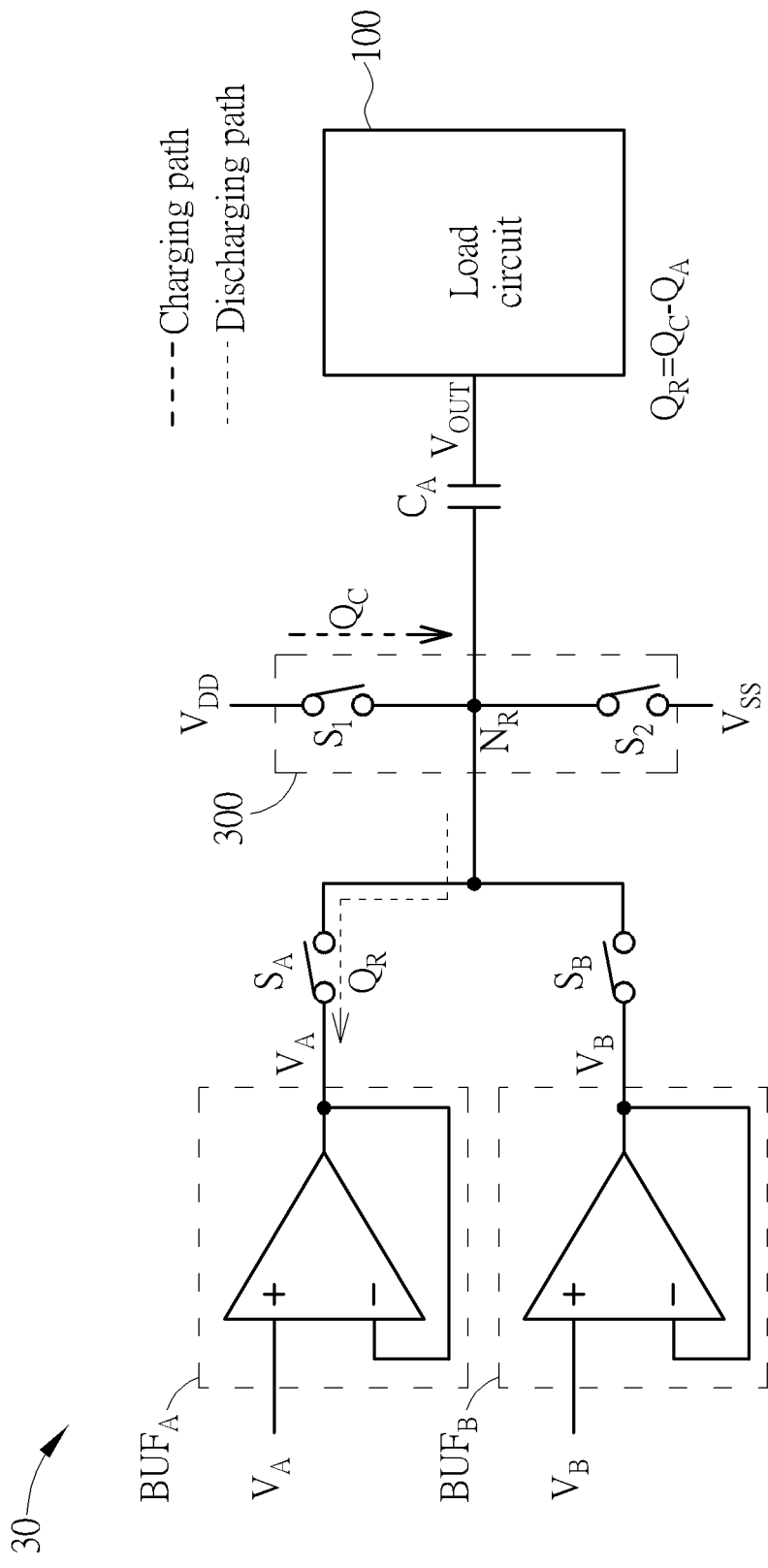
FIGS. 11 and 12 are schematic diagrams of the switched capacitor circuit with another implementation of the charge compensation circuit according to an embodiment of the present invention.
Figure 12:
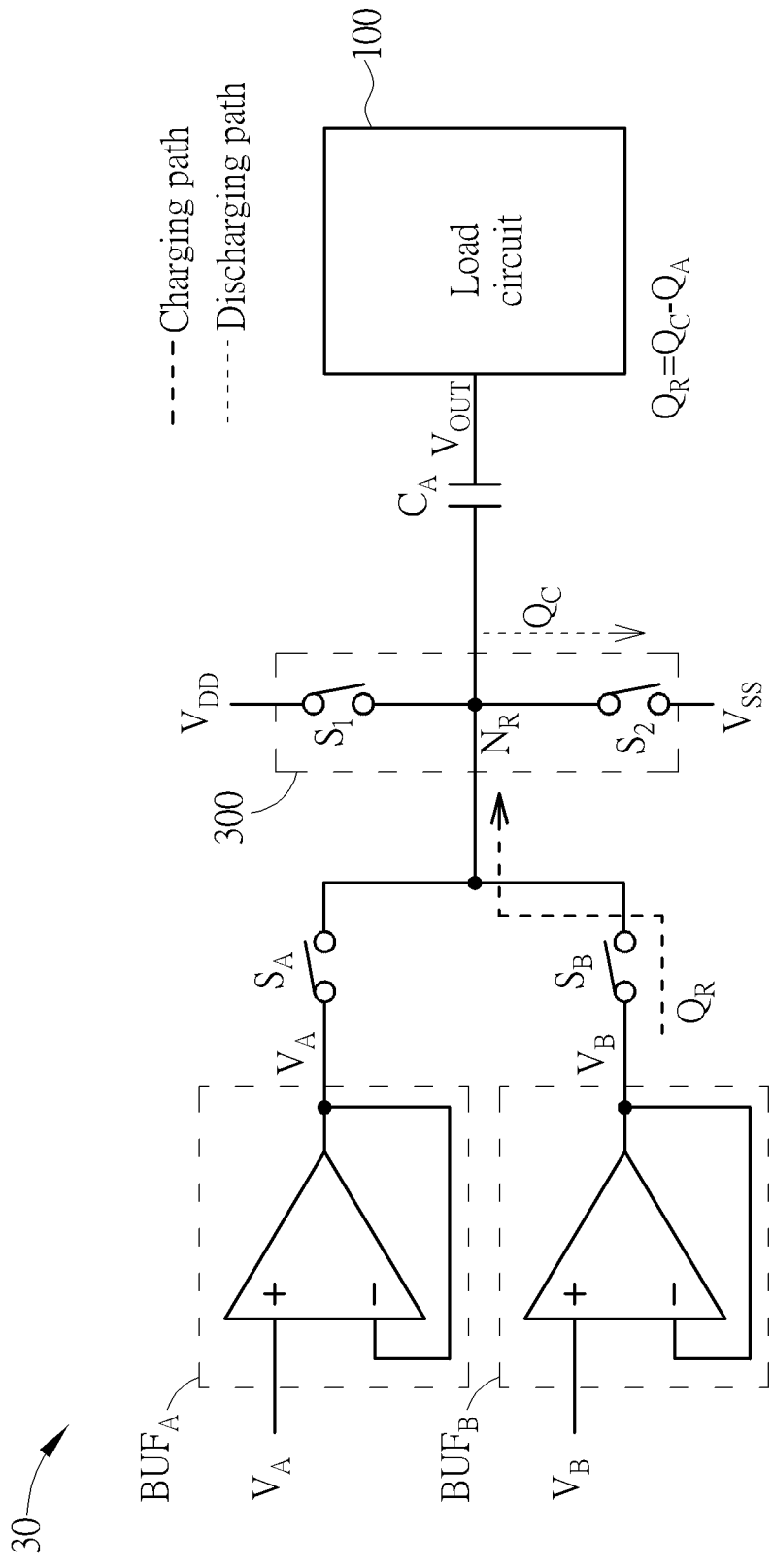

Please refer to FIGS. 11 and 12, which are schematic diagrams of the switched capacitor circuit 30 with another implementation of the charge compensation circuit 300 according to an embodiment of the present invention. As shown in FIGS. 11 and 12, the charge compensation circuit 300 may include two compensation switches $S_1$ and $S_2$. The compensation switch $S_1$ is coupled between the reference node $N_R$ and the first power supply node for receiving the first supply voltage $V_{DD}$, and the compensation switch $S_2$ is coupled between the reference node $N_R$ and the second power supply node for receiving the second supply voltage $V_{SS}$.

Figure 13:
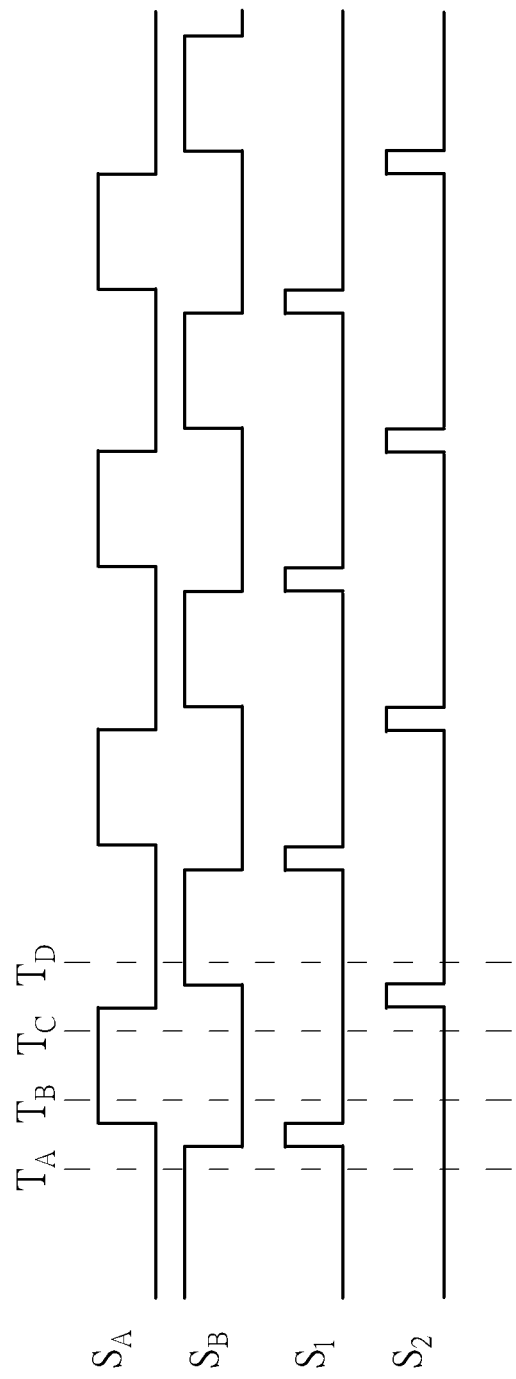
FIG. 13 is an exemplary waveform diagram of the operations of the switched capacitor circuit shown in FIGS. 11 and 12.

FIG. 13 is an exemplary waveform diagram of the operations of the switched capacitor circuit 30 shown in FIGS. 11 and 12. FIG. 13 illustrates the waveforms of control signals for the transmission switches $S_A$ and $S_B$ and the compensation switches $S_1$ and $S_2$, where those control signals at a higher level may turn on (connect) the corresponding switches and at a lower level may turn off (disconnect) the corresponding switches. The detailed operations of the transmission switches $S_A$ and $S_B$ are similar to those of the switched capacitor circuit 10 as described in the above paragraphs, and will not be repeated herein.

Please continue to refer to FIG. 13 together with FIG. 11, which illustrates a charging operation of the charge compensation circuit 300. At the time point $T_A$, the switch $S_A$ is turned off and the switch $S_B$ is turned on, and the voltage of the reference node $N_R$ is $V_B$. At the time point $T_B$, the switch $S_A$ is turned on and the switch $S_B$ is turned off, and the voltage of the reference node $N_R$ is $V_A$. From the time point $T_A$ to $T_B$ where the reference node $N_R$ is switched from the lower voltage $V_B$ to the higher voltage $V_A$, there is a small time period in which the compensation switch $S_1$ is turned on, and meanwhile, the transmission switches $S_A$ and $S_B$ may be turned off. At this moment, the output capacitor $C_A$ may receive electric charges from the first power supply node, so that the reference node $N_R$ may be charged to the first supply voltage $V_{DD}$. Subsequently, the switch $S_A$ is turned on and the switch $S_1$ is turned off at the time point $T_B$, and the reference node $N_R$ is coupled to the reference buffer $BUF_A$ for receiving the voltage $V_A$.

In such a situation, the charge compensation circuit 300 may supply electric charges to the output capacitor $C_A$ (i.e., $Q_C$), allowing the reference node $N_R$ to be charged to the first supply voltage $V_{DD}$. Supposing that the first supply voltage $V_{DD}$ is higher than the voltage $V_A$, the reference buffer $BUF_A$ should release electric charges from the output capacitor $C_A$, to drive the reference node $N_R$ to fall to the voltage $V_A$ from the first supply voltage $V_{DD}$, and the released electric charge amount is $Q_R$. Therefore, the amount of electric charges required to be released through the reference buffer $BUF_A$ may be equal to the compensation electric charges supplied from the charge compensation circuit 300 minus the total amount of electric charges required for driving the reference node $N_R$ to the voltage $V_A$ from the voltage $V_B$ (i.e., $Q_A$); that is, $Q_R=Q_C-Q_A$. If the voltage $V_A$ is close to the first supply voltage $V_{DD}$ (which means that the electric charge amount $Q_A$ is close to $Q_C$), the reference buffer $BUF_A$ may not need to have larger output capability, so that the power consumption of the reference buffer $BUF_A$ may be reduced. Also, the settling speed of the voltages of the switched capacitor circuit 30 may be improved due to the strong output capability of the charge compensation circuit 300.

In another embodiment, with an even shorter turned-on pulse of the compensation switch $S_1$ between the time point $T_A$ and $T_B$, or if the first supply voltage $V_{DD}$ is lower than the voltage $V_A$, the charge compensation circuit 300 may only supply partial electric charges for the output capacitor $C_A$, and the reset electric charges are supplied from the reference buffer $BUF_A$ to allow the reference node $N_R$ to reach its target voltage $V_A$. In this manner, the requirement of output capability of the reference buffer $BUF_A$ may also be reduced, so that the power consumption of the reference buffer $BUF_A$ may be reduced. Also, the settling speed of the voltages of the switched capacitor circuit 30 may still be improved.

Please continue to refer to FIG. 13 together with FIG. 12, which illustrates a discharging operation of the charge compensation circuit 300. At the time point $T_C$, the switch $S_A$ is turned on and the switch $S_B$ is turned off, and the voltage of the reference node $N_R$ is $V_A$. At the time point $T_D$, the switch $S_A$ is turned off and the switch $S_B$ is turned on, and the voltage of the reference node $N_R$ is $V_B$. From the time point $T_C$ to $T_D$ where the reference node $N_R$ is switched from the higher voltage $V_A$ to the lower voltage $V_B$, there is a small time period in which the compensation switch $S_2$ is turned on, and meanwhile, the transmission switches $S_A$ and $S_B$ may be turned off. At this moment, electric charges on the output capacitor $C_A$ may be released to the second power supply node, so that the reference node $N_R$ may be discharged to the second supply voltage $V_{SS}$. Subsequently, the switch Sp is turned on and the switch $S_2$ is turned off at the time point $T_D$, and the reference node $N_R$ is coupled to the reference buffer $BUF_B$ for receiving the voltage $V_B$.

In such a situation, the charge compensation circuit 300 may release electric charges from the output capacitor $C_A$ (i.e., $Q_C$), allowing the reference node $N_R$ to be discharged to the second supply voltage $V_{SS}$. Supposing that the second supply voltage $V_{SS}$ is lower than the voltage $V_B$, the reference buffer $BUF_B$ should supply electric charges to the output capacitor $C_A$, to drive the reference node $N_R$ to rise to the voltage $V_B$ from the second supply voltage $V_{SS}$, and the supplied electric charge amount is $Q_R$. Therefore, the amount of electric charges required to be supplied from the reference buffer $BUF_B$ may be equal to the compensation electric charges released through the charge compensation circuit 300 minus the total amount of electric charges required for driving the reference node $N_R$ to the voltage $V_B$ from the voltage $V_A$ (i.e., $Q_A$); that is, $Q_R=Q_C-Q_A$. If the voltage $V_B$ is close to the second supply voltage $V_{SS}$ (which means that the electric charge amount $Q_A$ is close to $Q_C$), the reference buffer $BUF_B$ may not need to have larger output capability, so that the power consumption of the reference buffer $BUF_B$ may be reduced. Also, the settling speed of the voltages of the switched capacitor circuit 30 may be improved due to the strong output capability of the charge compensation circuit 300.

In another embodiment, with an even shorter turned-on pulse of the compensation switch $S_2$ between the time point $T_C$ and $T_D$, or if the second supply voltage $V_{SS}$ is higher than the voltage $V_B$, the charge compensation circuit 300 may only release partial electric charges from the output capacitor $C_A$, and the reset electric charges are released through the reference buffer $BUF_B$ to allow the reference node $N_R$ to reach its target voltage $V_B$. In this manner, the requirement of output capability of the reference buffer $BUF_B$ may also be reduced, so that the power consumption of the reference buffer $BUF_B$ may be reduced. Also, the settling speed of the voltages of the switched capacitor circuit 30 may still be improved.

Figure 14:
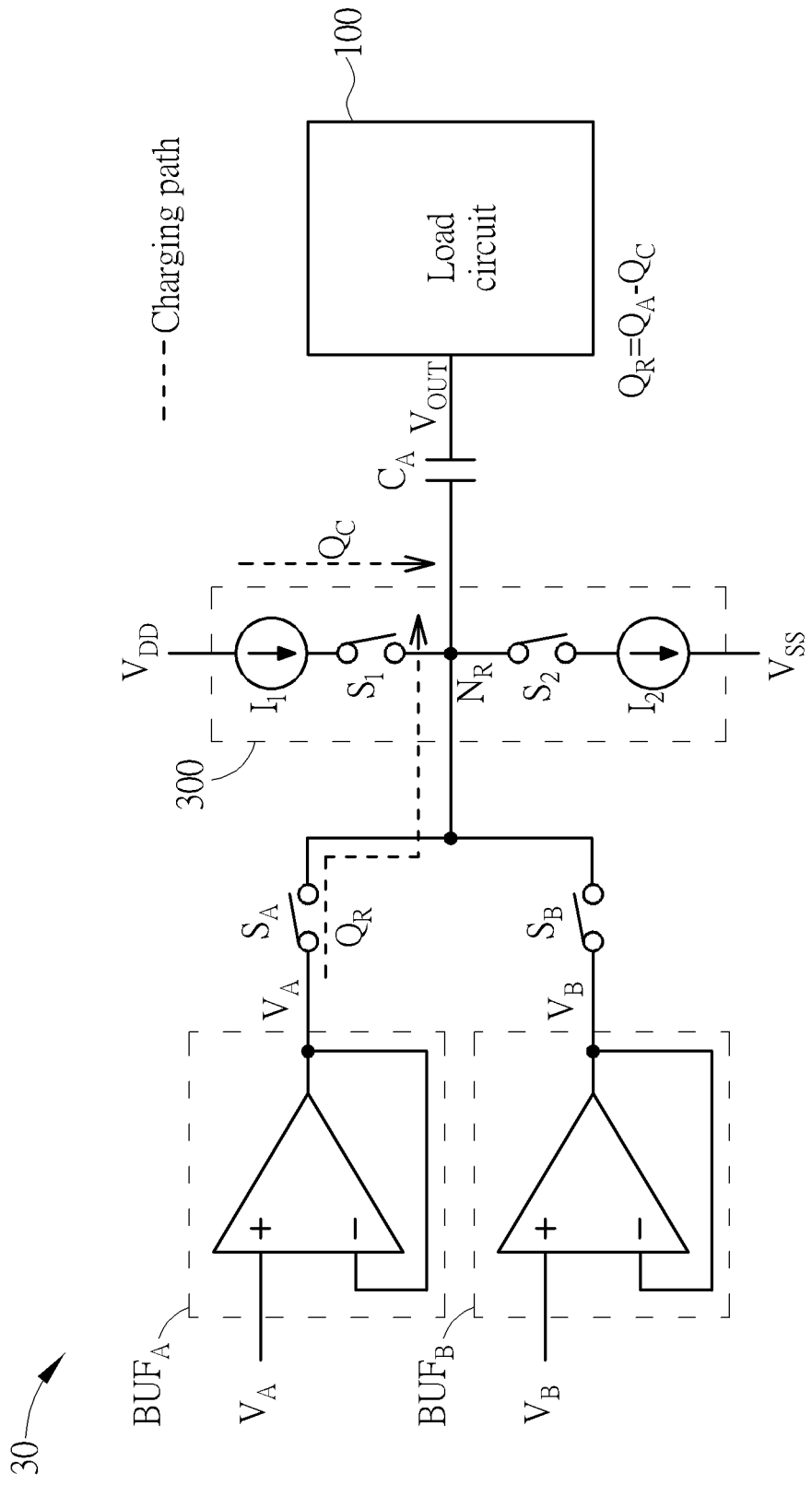
FIGS. 14 and 15 are schematic diagrams of the switched capacitor circuit with an additional implementation of the charge compensation circuit according to an embodiment of the present invention.
Figure 15:
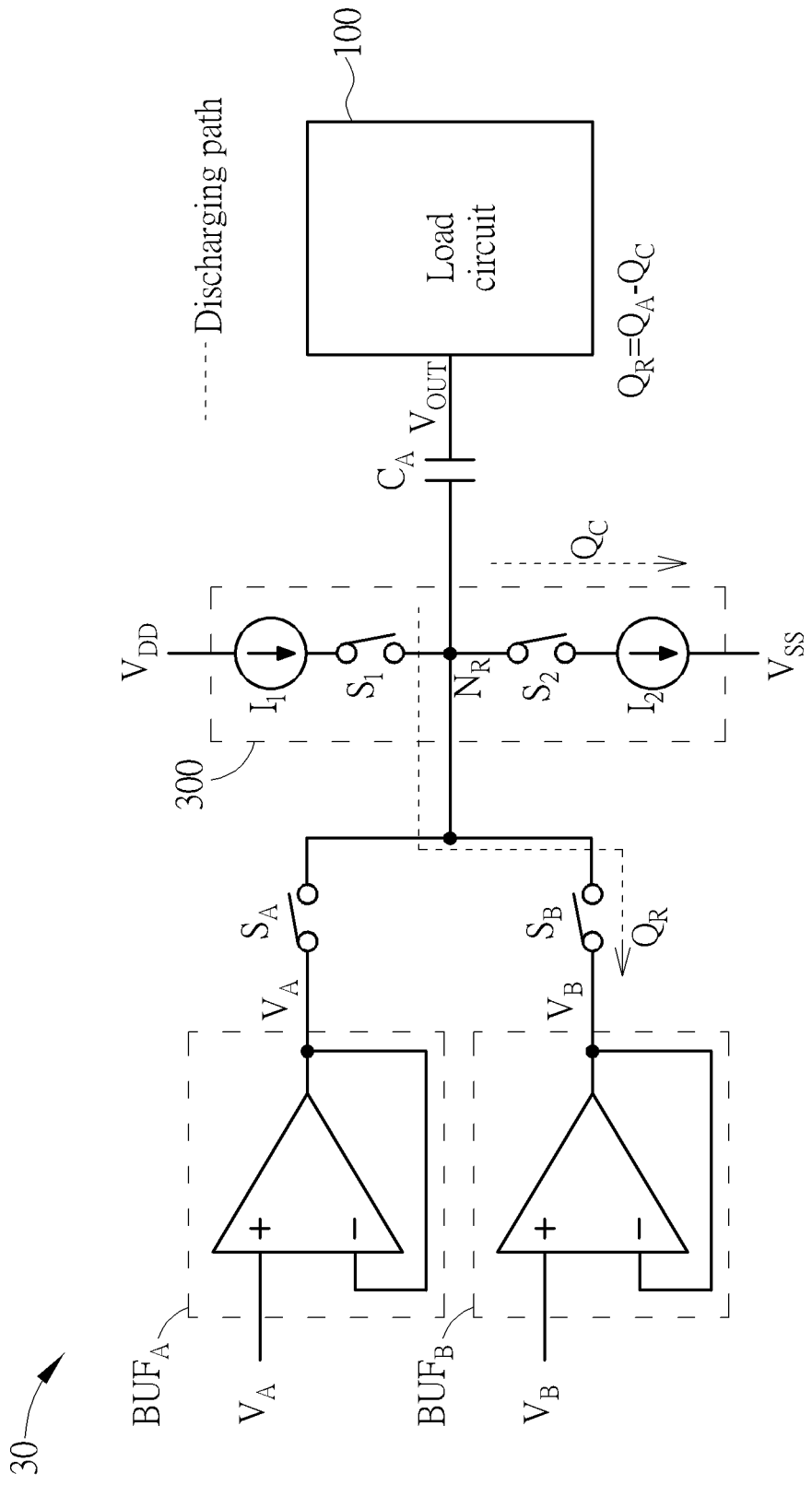

Please refer to FIGS. 14 and 15, which are schematic diagrams of the switched capacitor circuit 30 with an additional implementation of the charge compensation circuit 300 according to an embodiment of the present invention. As shown in FIGS. 14 and 15, the charge compensation circuit 300 may include two compensation switches $S_1$ and $S_2$ and two current sources $I_1$ and $I_2$. The compensation switches $S_1$ and $S_2$ are coupled to the reference node $N_R$. The current source $I_1$ is coupled between the compensation switch $S_1$ and the first power supply node. The current source $I_2$ is coupled between the compensation switch $S_2$ and the second power supply node.

The waveforms regarding the operations of the switched capacitor circuit 30 shown in FIGS. 14 and 15 are similar to those shown in FIG. 13, where the waveforms of control signals for the transmission switches $S_A$ and $S_B$ and the compensation switches $S_1$ and $S_2$ are illustrated. The detailed operations of the transmission switches $S_A$ and $S_B$ are similar to those of the switched capacitor circuit 10 as described in the above paragraphs, and will not be repeated herein.

Please continue to refer to FIG. 13 together with FIG. 14, which illustrates a charging operation of the charge compensation circuit 300. At the time point $T_A$, the switch $S_A$ is turned off and the switch $S_B$ is turned on, and the voltage of the reference node $N_R$ is $V_B$. At the time point $T_B$, the switch $S_A$ is turned on and the switch $S_B$ is turned off, and the voltage of the reference node $N_R$ is $V_A$. From the time point $T_A$ to $T_B$ where the reference node $N_R$ is switched from the lower voltage $V_B$ to the higher voltage $V_A$, there is a small time period in which the compensation switch $S_1$ is turned on, and meanwhile, the transmission switches $S_A$ and $S_B$ may be turned off. At this moment, the output capacitor $C_A$ may receive electric charges from the current source $I_1$, and the amount of received electric charges may be determined based on the turned-on pulse length of the compensation switch $S_1$. Subsequently, the switch $S_A$ is turned on and the switch $S_1$ is turned off at the time point $T_B$, and the reference node $N_R$ is coupled to the reference buffer $BUF_A$ for receiving the voltage $V_A$. At this moment, the current source $I_1$ may be cut off through the turned-off switch $S_1$, in order to prevent redundant current consumption.

In such a situation, the charge compensation circuit 300 may supply electric charges to the output capacitor $C_A$ (i.e., $Q_C$) by charging the output capacitor $C_A$ with the current source $I_1$, and the rest electric charges are received from the reference buffer $BUF_A$. Therefore, the amount of electric charges required to be supplied from the reference buffer $BUF_A$ (i.e., $Q_R$) may be reduced to the total amount of electric charges required for driving the output capacitor $C_A$ (i.e., $Q_A$) minus the compensation electric charges supplied from the charge compensation circuit 300; that is, $Q_R=Q_A-Q_C$. As a result, the reference buffer $BUF_A$ may not need to have larger output capability, so that the power consumption of the reference buffer $BUF_A$ may be reduced. Also, the settling speed of the voltages of the switched capacitor circuit 30 may be improved due to the strong output capability of the charge compensation circuit 300.

Please continue to refer to FIG. 13 together with FIG. 15, which illustrates a discharging operation of the charge compensation circuit 300. At the time point $T_C$, the switch $S_A$ is turned on and the switch $S_B$ is turned off, and the voltage of the reference node $N_R$ is $V_A$. At the time point $T_B$, the switch $S_A$ is turned off and the switch $S_B$ is turned on, and the voltage of the reference node $N_R$ is $V_B$. From the time point $T_C$ to $T_B$ where the reference node $N_R$ is switched from the higher voltage $V_A$ to the lower voltage $V_B$, there is a small time period in which the compensation switch $S_2$ is turned on, and meanwhile, the transmission switches $S_A$ and $S_B$ may be turned off. At this moment, electric charges on the output capacitor $C_A$ may be released through the current source $I_2$, and the amount of released electric charges may be determined according to the turned-on pulse length of the compensation switch $S_2$. Subsequently, the switch $S_D$ is turned on and the switch $S_2$ is turned off at the time point $T_D$, and the reference node $N_R$ is coupled to the reference buffer $BUF_B$ for receiving the voltage $V_B$. At this moment, the current source $I_2$ may be cut off through the turned-off switch $S_2$, in order to prevent redundant current consumption.

In such a situation, the charge compensation circuit 300 may draw electric charges from the output capacitor $C_A$ (i.e., $Q_C$) by discharging the output capacitor $C_A$ with the current source $I_2$, and the rest electric charges are released through the reference buffer $BUF_B$. Therefore, the amount of electric charges required to be released through the reference buffer $BUF_B$ (i.e., $Q_R$) may be reduced to the total amount of electric charges required for driving the output capacitor $C_A$ (i.e., $Q_A$) minus the compensation electric charges drawn by the charge compensation circuit 300; that is, $Q_R=Q_A-Q_C$. As a result, the reference buffer $BUF_B$ may not need to have larger output capability, so that the power consumption of the reference buffer $BUF_B$ may be reduced. Also, the settling speed of the voltages of the switched capacitor circuit 30 may be improved due to the strong output capability of the charge compensation circuit 300.

Figure 16:
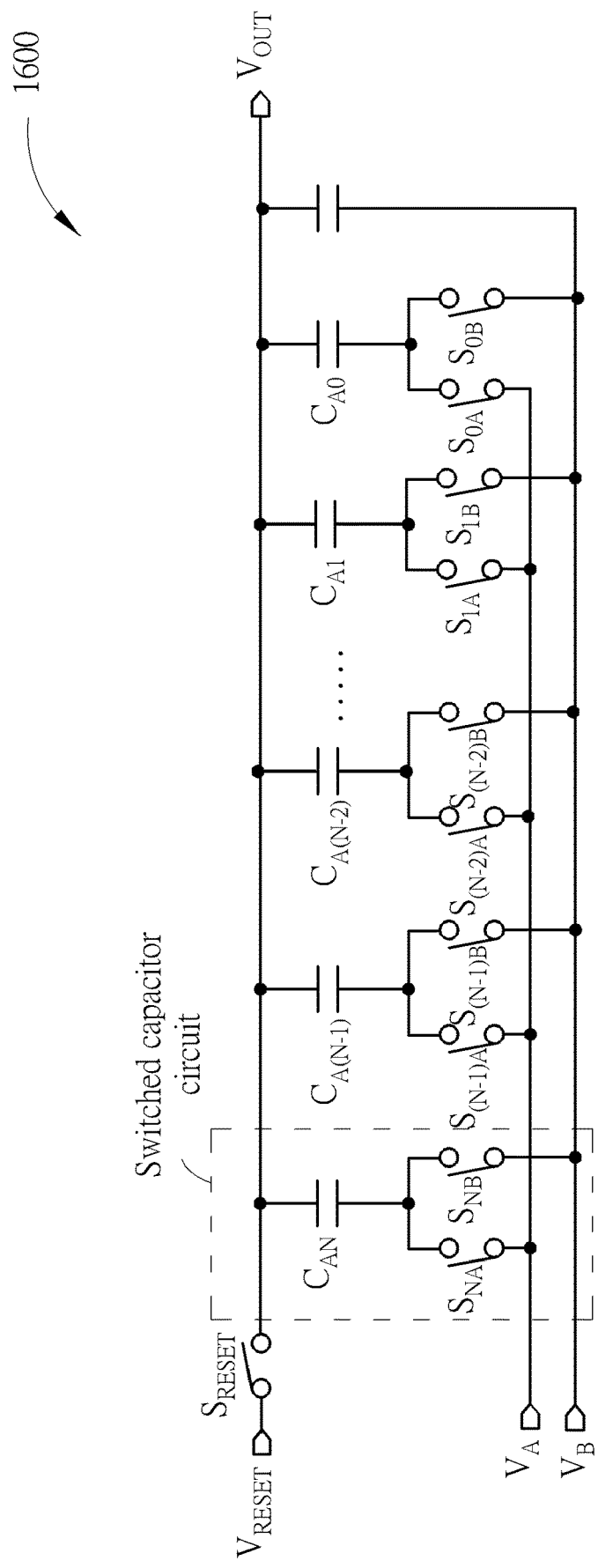
FIG. 16 is a schematic diagram of a general capacitive DAC.

Please refer to FIG. 16, which is a schematic diagram of a general capacitive digital-to-analog converter (DAC) 1600. As shown in FIG. 16, the capacitive DAC 1600 is composed of a plurality of switched capacitor circuits, each of which includes an output capacitor ($C_{AN}$–$C_{A0}$) and two transmission switches ($S_{NA}$–$S_{0A}$, $S_{NB}$–$S_{0D}$). The switched capacitor circuit has a circuit structure similar to the switched capacitor circuit 10 as shown in FIG. 1. In detail, the first terminal of the output capacitor $C_{AN}$–$C_{A0}$ is commonly coupled to the output terminal of the capacitive DAC 1600. The transmission switches $S_{NA}$–$S_{0A}$ are respectively coupled between the second terminal of the output capacitors $C_{AN}$–$C_{A0}$ and a first input terminal for receiving the voltage $V_A$ through a reference buffer (not illustrated in FIG. 16 for brevity). The transmission switches $S_{NB}$–$S_{OB}$ are respectively coupled between the second terminal of the output capacitors $C_{AN}$–$C_{A0}$ and a second input terminal for receiving the voltage $V_B$ through another reference buffer (not illustrated in FIG. 16 for brevity). The transmission switches $S_{NA}$–$S_{0A}$ and $S_{NB}$–$S_{OB}$ allow the second terminal of the output capacitors $C_{AN}$–$C_{A0}$ to be switched between the voltages $V_A$ and $V_B$. Taking the output capacitor $C_{AN}$ as an example, the second terminal of the output capacitor $C_{AN}$ is configured to receive the voltage $V_A$ when the switch $S_{NA}$ is turned on and the switch $S_{NB}$ is turned off, and configured to receive the voltage $V_B$ when the switch $S_{NA}$ is turned off and the switch $S_{NB}$ is turned on. The output terminal of capacitive DAC 1600 is further coupled to a reset terminal for receiving a reset voltage $V_{RESET}$ through a reset switch $S_{RESET}$.

In the capacitive DAC 1600, the capacitance values of the output capacitors $C_{AN}$–$C_{A0}$ are arranged to be binary weighted. In other words, the capacitance value of each output capacitor may be twice the capacitance value of its adjacent output capacitor (e.g., $C_{AN}=2\times C_{A(N-1)}$, $C_{A(N-1)}=2\times C_{A(N-2)}$, ..., $C_{A1}=2\times C_{A0}$). The input digital data may be converted into control signals for controlling the transmission switches $S_{NA}$–$S_{0A}$ and $S_{NB}$–$S_{OB}$, to switch the voltages at the second terminal of the output capacitors $C_{AN}$–$C_{A0}$, which further couple the electric charges to their first terminal to generate the output voltage $V_{OUT}$ of the capacitive DAC 1600. In this example, the electric charges for voltage switching are entirely supplied from or released through the reference buffers that provide the voltages $V_A$ and $V_B$, and these two reference buffers are shared by all of the switched capacitor circuits. Due to the great number of switched capacitor circuits driven by the reference buffers and the large capacitance values of the output capacitors under the binary weighted arrangement, the output capability of the reference buffers should be quite strong in order to satisfy the requirements of electric charge amount in the capacitive DAC 1600.

Figure 17:
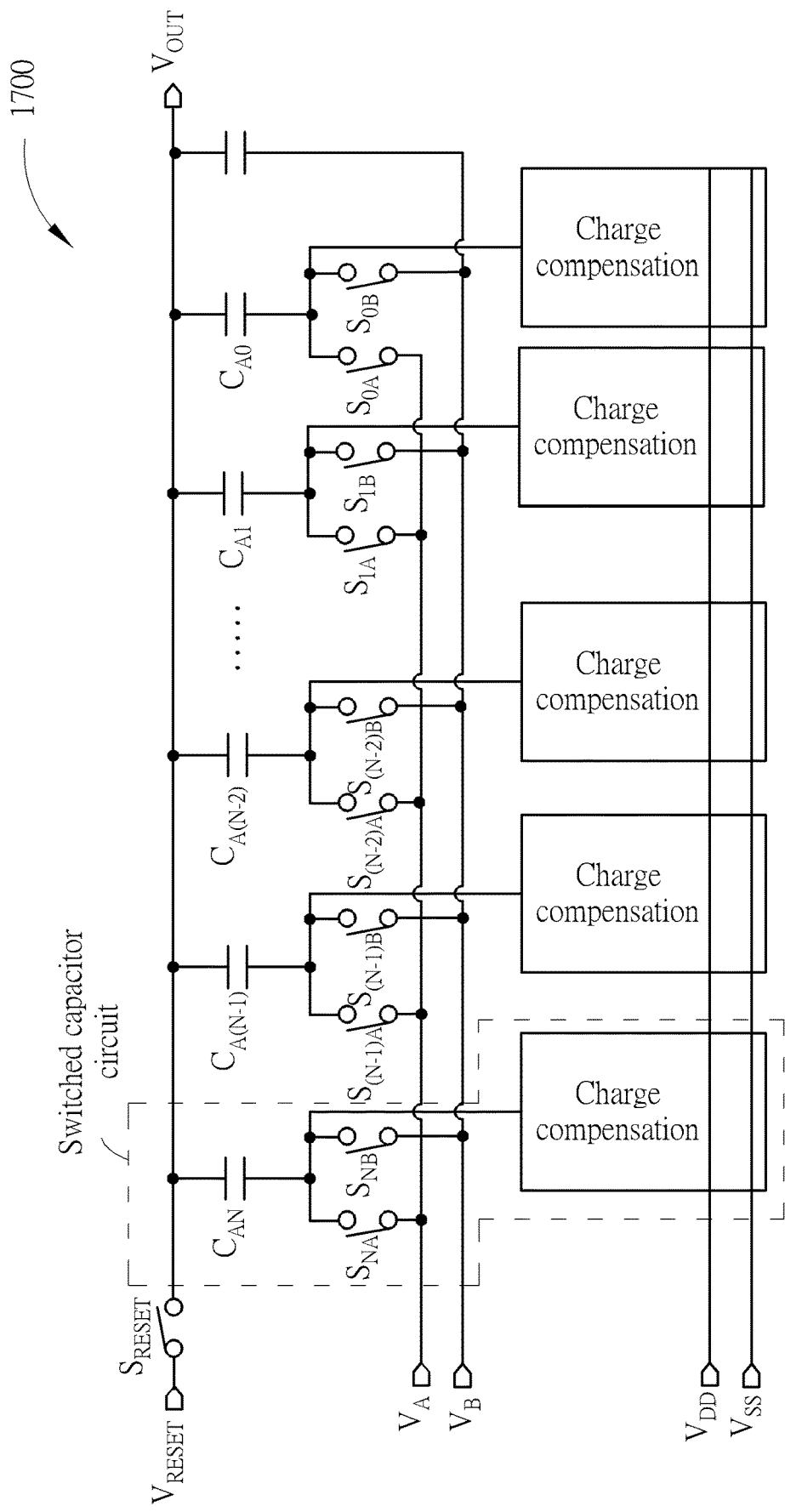
FIG. 17 is a schematic diagram of a capacitive DAC according to an embodiment of the present invention.

Please refer to FIG. 17, which is a schematic diagram of a capacitive DAC 1700 according to an embodiment of the present invention. As shown in FIG. 17, the circuit structure of the capacitive DAC 1700 is similar to the circuit structure of the capacitive DAC 1600 shown in FIG. 16, so signals and elements having similar functions are denoted by the same symbols. The difference between the capacitive DAC 1700 and the capacitive DAC 1600 is that, in the capacitive DAC 1700, each switched capacitor circuit further includes a charge compensation circuit. The charge compensation circuit is coupled to the second terminal of the corresponding output capacitor $C_{AN}$–$C_{A0}$, for compensating electric charges for the output capacitor $C_{AN}$–$C_{A0}$.

During the voltage switching operations, the charge compensation circuit may charge or discharge the output capacitor $C_{AN}$–$C_{A0}$ according to the voltage change. For example, when the output capacitor is switched from the lower voltage $V_B$ to the higher voltage $V_A$, the charge compensation circuit is configured to supply electric charges from the first supply voltage $V_{DD}$ to charge the output capacitor. When the output capacitor is switched from the higher voltage $V_A$ to the lower voltage $V_B$, the charge compensation circuit is configured to release electric charges to the second supply voltage $V_{SS}$ to discharge the output capacitor. As a result, partial of the electric charges are supplied from or released to the charge compensation circuit, and the output capability of the reference buffers may be reduced, which leads to less power consumption of the reference buffers. Also, the settling speed of the voltages of the switched capacitor circuit may be improved due to the strong output capability of the charge compensation circuit. Note that the detailed implementations and operations of the switched capacitor circuits of the capacitive DAC 1700 and the related charge compensation circuit are similar to those shown in FIGS. 3 and 4, and the embodiments for various implementations of the charge compensation circuit described in this disclosure are all applicable to the capacitive DAC 1700.

Please note that the present invention aims at providing a switched capacitor circuit having a charge compensation circuit capable of supplying or releasing electric charges. Those skilled in the art may make modifications and alterations accordingly. For example, in the above embodiments, the electric charges of the charge compensation circuit are supplied from the first supply voltage $V_{DD}$ and released to the second supply voltage $V_{SS}$. These supply voltages may be the highest or lowest voltage level supplied by the global voltage sources of the circuit system. In another embodiment, the supply voltages $V_{DD}$ and/or $V_{SS}$ may have any appropriate level generated from a specific voltage source or voltage generator. As long as the supply voltage is capable of compensating the required electric charges and the driving capability of the charge compensation circuit is strong enough, any appropriate voltage level may be feasible. Note that the steady state voltage of the reference node is received from the reference buffer, not determined by the charge compensation circuit.

In addition, in the embodiments of the present invention, the first terminal of the output capacitor is coupled to the output terminal of the switched capacitor circuit and the capacitive DAC, and the second terminal of the output capacitor is coupled to the reference node, the transmission switches and the charge compensation circuit. In an exemplary embodiment, the top plate of the output capacitor may be implemented as its first terminal, and the bottom plate of the output capacitor may be implemented as its second terminal. Alternatively, the top plate of the output capacitor may be implemented as its second terminal, and the bottom plate of the output capacitor may be implemented as its first terminal.

To sum up, the present invention provides a switched capacitor circuit having a charge compensation circuit capable of supplying or releasing electric charges, where the switched capacitor circuit is applicable to a capacitive DAC or any other circuit module. The charge compensation circuit may supply or release electric charges for the output capacitor of the switched capacitor circuit, where the electric charges may be pushed or pulled through the reference buffer originally. Therefore, the burden on the reference buffer may be reduced, which decreases the requirements of output capability of the reference buffer, so that the power consumption of the reference buffer may also be saved. In addition, due to the strong driving capability of the charge compensation circuit, the settling speed of the voltage of the output capacitor may be accelerated, which increases the operation speed of the switched capacitor circuit and the capacitive DAC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A switched capacitor circuit, comprising:
   an output capacitor, comprising:
      a first terminal, coupled to an output terminal of the switched capacitor circuit; and
      a second terminal, coupled to a reference node;
   a first transmission switch, coupled to the reference node;
   a first reference buffer, coupled to the first transmission switch;
   a second transmission switch, coupled to the reference node;
   a second reference buffer, coupled to the second transmission switch; and
   a charge compensation circuit, coupled between the first transmission switch, the second transmission switch and the output capacitor.

2. The switched capacitor circuit of claim 1, wherein the charge compensation circuit is configured to charge or discharge the output capacitor according to a voltage change on the reference node.

3. The switched capacitor circuit of claim 1, wherein the charge compensation circuit is configured to charge the output capacitor by receiving electric charges from a first power supply node.

4. The switched capacitor circuit of claim 1, wherein the charge compensation circuit is configured to discharge the output capacitor by releasing electric charges to a second power supply node.

5. The switched capacitor circuit of claim 1, wherein the charge compensation circuit is configured to charge the output capacitor when the reference node is switched from a second voltage supplied through the second reference buffer to a first voltage supplied through the first reference buffer, wherein the first voltage is higher than the second voltage.

6. The switched capacitor circuit of claim 1, wherein the charge compensation circuit is configured to discharge the output capacitor when the reference node is switched from a first voltage supplied through the first reference buffer to a second voltage supplied through the second reference buffer, wherein the second voltage is lower than the first voltage.

7. The switched capacitor circuit of claim 1, wherein the charge compensation circuit comprises:
   a compensation capacitor, comprising:
      a first terminal, coupled to the reference node; and
      a second terminal;
   a first compensation switch, coupled to the second terminal of the compensation capacitor; and
   a second compensation switch, coupled to the second terminal of the compensation capacitor.

8. The switched capacitor circuit of claim 7, wherein the first compensation switch is further coupled to a first power supply node, and the second compensation switch is further coupled to a second power supply node.

9. The switched capacitor circuit of claim 8, wherein the first compensation switch is turned on to receive electric charges from the first power supply node when the first transmission switch is turned on and the reference node receives a first voltage from the first reference buffer.

10. The switched capacitor circuit of claim 8, wherein the second compensation switch is turned on to release electric charges to the second power supply node when the second transmission switch is turned on and the reference node receives a second voltage from the second reference buffer.

11. The switched capacitor circuit of claim 7, wherein the charge compensation circuit further comprises:
   a third compensation switch, coupled between the reference node and the compensation capacitor.

12. The switched capacitor circuit of claim 11, wherein the third compensation switch is turned on when a voltage of the reference node is switched.

13. The switched capacitor circuit of claim 1, wherein the charge compensation circuit comprises:
- a first compensation switch, coupled between the reference node and a first power supply node; and
- a second compensation switch, coupled between the reference node and a second power supply node.

14. The switched capacitor circuit of claim 13, wherein the first compensation switch is turned on when the reference node is switched from a second voltage to a first voltage higher than the second voltage, allowing the output capacitor to receive electric charges from the first power supply node.

15. The switched capacitor circuit of claim 13, wherein the second compensation switch is turned on when the reference node is switched from a first voltage to a second voltage lower than the first voltage, allowing the output capacitor to release electric charges to the second power supply node.

16. The switched capacitor circuit of claim 1, wherein the charge compensation circuit comprises:
- a first compensation switch, coupled to the reference node;
- a first current source, coupled between the first compensation switch and a first power supply node;
- a second compensation switch, coupled to the reference node; and
- a second current source, coupled between the second compensation switch and a second power supply node.

17. The switched capacitor circuit of claim 16, wherein the first compensation switch is turned on when the reference node is switched from a second voltage to a first voltage higher than the second voltage, allowing the output capacitor to receive electric charges from the first current source.

18. The switched capacitor circuit of claim 16, wherein the second compensation switch is turned on when the reference node is switched from a first voltage to a second voltage lower than the first voltage, allowing the output capacitor to release electric charges to the second current source.

19. A capacitive digital-to-analog converter (DAC), comprising:
- a plurality of switched capacitor circuits, each comprising:
  - an output capacitor, comprising:
    - a first terminal, coupled to an output terminal of the capacitive DAC; and
    - a second terminal, coupled to a reference node;
  - a first transmission switch, coupled between the reference node and a first reference buffer;
  - a second transmission switch, coupled between the reference node and a second reference buffer; and
  - a charge compensation circuit, coupled between the first transmission switch, the second transmission switch and the output capacitor.

20. The capacitive DAC of claim 19, wherein the charge compensation circuit is configured to charge or discharge the output capacitor according to a voltage change on the reference node.

* * * * *